United States Patent
Murata et al.

(10) Patent No.: US 7,349,287 B2
(45) Date of Patent: Mar. 25, 2008

(54) ADDRESS DECODER, STORAGE DEVICE, PROCESSOR DEVICE, AND ADDRESS DECODING METHOD FOR THE STORAGE DEVICE

(75) Inventors: Seiji Murata, Kawasaki (JP); Hiroshi Nakadai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 140 days.

(21) Appl. No.: 11/385,717

(22) Filed: Mar. 22, 2006

(65) Prior Publication Data

US 2007/0147163 A1  Jun. 28, 2007

(30) Foreign Application Priority Data

Dec. 28, 2005  (JP) .............................. 2005-376972

(51) Int. Cl.
*G11C 8/00* (2006.01)
(52) U.S. Cl. .............................. 365/230.06; 365/189.08
(58) Field of Classification Search ........... 365/230.06, 365/189.08
See application file for complete search history.

(56) References Cited

U.S. PATENT DOCUMENTS 5,673,048 A  9/1997  Kearney et al.
6,026,045 A  2/2000  Son
6,144,612 A *  11/2000  Numasawa ............ 365/230.06
6,373,752 B1 *  4/2002  Wright et al. .......... 365/189.05

FOREIGN PATENT DOCUMENTS

| EP | 0 405 812 | 1/1991 |
| JP | 2002-63792 | 2/2002 |
| KR | 1994-12390 | 6/1994 |
| KR | 1998-072847 | 11/1999 |

OTHER PUBLICATIONS

Extended European Search Report, mailed Jan. 5, 2007, and issued in corresponding European Patent Application No. 06251653.9-1233.
US 6,026,045 (Reference AA) corresponds to KR 1998-072847 (Reference AH).
Korean Patent Office Action, mailed Apr. 26, 2007 and issued in corresponding Korean Patent Application No. 10-2006-0033225.

* cited by examiner

*Primary Examiner*—Son Dinh
(74) *Attorney, Agent, or Firm*—Staas & Halsey LLP

(57) ABSTRACT

The address decoder includes: a plurality of decode units each formed by a combinational logic circuit; an inverting circuit which inverts an output of said decode unit; an AND circuit which performs a logical AND operation between an output signal of said decode unit, which has been inverted by said inverting circuit, and another one of said plurality of decode units. This arrangement makes it possible to simplify the circuit construction, to improve the processing speed, and to reduce power consumption.

8 Claims, 10 Drawing Sheets

ADDRESS DECODER, STORAGE DEVICE, PROCESSOR DEVICE, AND ADDRESS DECODING METHOD FOR THE STORAGE DEVICE

BACKGROUND OF THE INVENTION (1) Field of the Invention

The present invention relates to the technology of decode processing for address signals in SRAMs (Static RAM) provided for processor devices such as CPUs (Central Processing Units).

(2) Description of the Related Art

SRAM (Static RAM) circuits, which are used in registers of CPUs (Central Processing Units) and cache memories, are provided with multiple memory cells for storing data therein, which memory cells are arranged in an array form.

FIG. 7 is a view showing a decode circuit and a memory cell of an SRAM. FIG. 8 is a diagram showing the decode circuit of FIG. 7 as a combination of two parts thereof: a predecoder; and a main decoder. In this instance, in the examples of FIG. 7 and FIG. 8, only one of the multiple memory cells is illustrated. FIG. 9 is a view showing a decode circuit and memory cells of a previous SRAM. This example is realized by a NAND circuit which is formed by a dynamic circuit {a circuit in which precharging is performed by a single pMOS circuit [p channel MOS (Metal Oxide Semiconductor)] and a logic function is configured with multiple nMOS (n channel MOS) circuits, when no clock is input}.

Hereinafter, to configure a circuit using a dynamic circuit will sometimes be referred to as "to dynamize a circuit".

As shown in FIG. 7, an SRAM 50 includes multiple memory cells 51 arranged in an array form (cell array 53; see FIG. 9) and a decode circuit (decoder) 52. These decode circuit 52 and memory cells 51 are connected to each other through a word line (select signal line) 54.

The decode circuit 52 decodes (address decoding) address signals, and is provided one for each memory cell 51. The decode circuit 52 decodes address signals received from outside the SRAM 50 and activates a word line 54 corresponding to the decode result, whereby read/write processing to the corresponding memory cell 51 is carried out.

Hereafter, reference character AD[*] (*is an integer of 0 through i−1; i is a natural number expressing the bit width of the address) denotes an input address, and the address signals corresponding to the input address are input. Further, reference character PC designates a precharge signal, and reference character EN designates an enable signal.

The example of FIG. 9 shows a construction of a decode circuit 52 which activates a memory cell 51-2, out of the memory cells 51-1 through 51-5 forming the cell array 53.

Generally speaking, as shown in FIG. 8 and FIG. 9, the decode circuit 52 is formed by two parts, a predecode circuit (predecoder) 521 and a main decode circuit (main decoder) 522, with consideration paid to the circuit size, wiring convenience, and delay. The predecoder 521 is equipped with decode units 55a formed by multiple combination logic circuits, and the main decoder 522 is equipped with decode units 55b also formed by multiple combination logic circuit. In FIG. 9, for convenience of illustration, only one decode unit 55b is shown.

In the predecoder 521, address signals are input to each of the decode units 55a and subjected to predecode processing. After that, the output signals from the decode units 55a are input to the decode units 55b of the main decoder 522 and subjected to main decode processing.

Further, as to the previous SRAM 50, these predecoder 521 and main decoder 522 are realized by NAND logics in the decode process in which the decode construction is divided into a predecoder and a main decoder, from the view point of good compatibility due to a construction using negative logic.

Enhanced speed in address decode processing is demanded in the art of SRAM 50. For example, the following patent document 1 discloses an art in which address signals are propagated to a decoder before a control signal which gives instructions about an operation of memory cells is activated. As a result, a decoder is activated after the activation of the control signal, thereby outputting decode signals, so that the speed of access is increased and erroneous operations are prevented.

The following techniques for increasing the speed of address decoding in an SRAM 50 are also used: dynamizing of a static circuit; increasing driving power, thereby improving delay; reducing the number of stages of n channel transistor tree connected in series and adjustment of the size thereof.

Here, as shown in FIG. 9, dynamizing of the static circuit is a technique in which a circuit is formed using only nMOS transistors, without using pMOS transistors. As a result, since the load of pMOS transistors can be reduced, the circuits are improved in speed.

[Patent Document 1] Japanese Patent Application Laid-open No. 2002-63792

However, in such previous SRAMs, if the drive power (drive ability) of transistors is simply increased for the purpose of increasing the speed of address decoding, the size of transistors is increased, so that the layout area is enlarged and the input capacity of a decoder and power consumption are increased.

Further, in cases where decode processing is realized by NAND logic, assuming that the number of address inputs is N, and that the number of predecoder inputs is i, the number of inputs to the main decoder is j=CELL (N/i) (CELL(x) . . . a ceiling function for x). Even though dynamizing is performed, the gate pass time in parallel with the (i+j) step (roughly estimated) is necessary for the address decode processing.

Here, in place of NAND logic, NOR logic can be used to realize decode processing. Further, this NOR logic can be dynamized (dynamic NOR circuit). By realizing the decode circuit 52 using a dynamic NOR circuit, the decode time is made to be fixed (for example, two steps) regardless of the number of addresses, so that address decoding can be improved in speed.

However, when a decode circuit is realized by a dynamic NOR circuit, (1) its output maintains the state of "H" when it matches an input address, and (2) its output is changed from the state of "H" to "L" when it does not match an input address. That is, except for the time during which decoding is being performed, all the word lines 54 are activated, thereby increasing power consumption, so that it is not preferable from the standpoint of an operation.

FIG. 10 is a view showing a decode circuit and memory cells of a previous SRAM. In this example, the decode circuit 52 is realized by a dynamic NOR circuit, and an AND circuit is provided for an output of the main decoder 522. In the example of FIG. 10, also, only one decode unit 55b is illustrated for the convenience of illustration.

For the purpose of decreasing power consumption, the example of FIG. 10 is provided with an AND circuit 56 at the output end of the decode units 55b of the main decoder 522. To this AND circuit 56, an output of the main decoder 22 and an enable clock (EN_B) are input, and an output of the main decoder 22 is pulsed with this enable clock.

However, as shown in FIG. 10, since the previous SRAM 50 has an AND circuit 56 arranged at the output end of the main decoder 522, a circuit for generating an enable clock needs to be provided. In addition, in the main decoder 522, timing adjustment required to be performed among the outputs of the decode units 55b makes the circuit construction complicated, and timing adjustment is troublesome.

Further, an operation must be guaranteed against manufacturing variations caused by miniaturization and high-density packaging of semiconductor devices at the time of manufacturing of SRAMs 50. Hence, a sufficient set-up time (the minimum margin time from when a signal is defined to when a clock is changed) needs to be ensured.

SUMMARY OF THE INVENTION

With the foregoing problems in view, it is an object of the present invention (i) to simplify a circuit construction, (ii) to improve the speed of processing and (iii) to reduce power consumption.

In order to accomplish the above object, according to the present invention, there is provided an address decoder connected to memory cells for selectively activating the memory cells according to input address signals, the address decoder comprising: a plurality of decode units each formed by a combinational logic circuit; an inverting circuit which inverts an output of the decode unit; an AND circuit which performs a logical AND operation between an output signal of the decode unit, which has been inverted by the inverting circuit, and another one of the plurality of decode units.

As a preferred feature, the address decoder further comprises: a plurality of predecode units which decode the input address signals, wherein the decode unit is connected to the plurality of predecode units, and receives outputs of the plurality of predecode units, and performs further decoding thereof.

As a generic feature, there is provided a storage device, comprising: a plurality of memory cells for storing information therein; and an address decoder which is connected to the memory cells and selectively activates the memory cells according to input address signals, the address decoder including: a plurality of decode units; an inverting circuit which inverts an output of the decode unit; an AND circuit which performs a logical AND operation between an output signal of the decode unit, which has been inverted by the inverting circuit, and another one of the plurality of decode units, and outputs the operation result as a select signal for activating the memory cells.

As a preferred feature, the storage device further comprises: a plurality of predecode units which decode the input address signals, wherein the decode unit is connected to the plurality of predecode units, and receives outputs of the plurality of predecode units, and performs further decoding thereof.

As a generic feature, there is provided a processor device, comprising a storage device, the storage device including: a plurality of memory cells for storing information therein; and an address decoder which is connected to the memory cells and selectively activates a memory cell according to input address signals, the address decoder including: a plurality of decode units each formed by a combinational logic circuit; an inverting circuit which inverts an output of the decode unit; an AND circuit which performs a logical AND operation between an output signal of the decode unit, which has been inverted by the inverting circuit, and another one of the plurality of decode units, and outputs the operation result as a select signal for activating the memory cells.

As a preferred feature, the address decoder includes: a plurality of predecode units which decode the input address signals, wherein the decode unit is connected to the plurality of predecode units, and receives outputs of the plurality of predecode units, and performs further decoding thereof.

As another generic feature, there is provided an address decoding method for the storage device which selectively activates a memory cell according to input address signals, the method comprising: decoding the input address signals by means of a combination logic circuit; inverting the decode result obtained by the decoding step; and performing a logical AND operation between the decoding result, which has been inverted by the inverting step, and another decoding result obtained by the decoding step, and outputting the operation result as a select signal for activating said memory cells.

As a preferred feature, the decoding step includes: a plurality of predecoding steps for decoding the input address signals; and a main decoding step for receiving the decoding result obtained by the plurality of predecoding steps and performing further decoding thereof.

The present invention guarantees at least one of the following advantageous results:

(1) the circuit construction is simplified, so that the circuit area is decreased and the processing speed is improved;

(2) power consumption is reduced;

(3) effort in circuit design is reduced;

(4) timing self-correction effects can be expected with respect to manufacturing variations at the time of LSI manufacturing.

Other objects and further features of the present invention will be apparent from the following detailed description when read in conjunction with the accompanying drawings.

DESCRIPTION OF THE PREFERRED EMBODIMENT(S)

One preferred embodiment of the present invention will now be described with reference to the relevant accompanying drawings.

Figure 1:
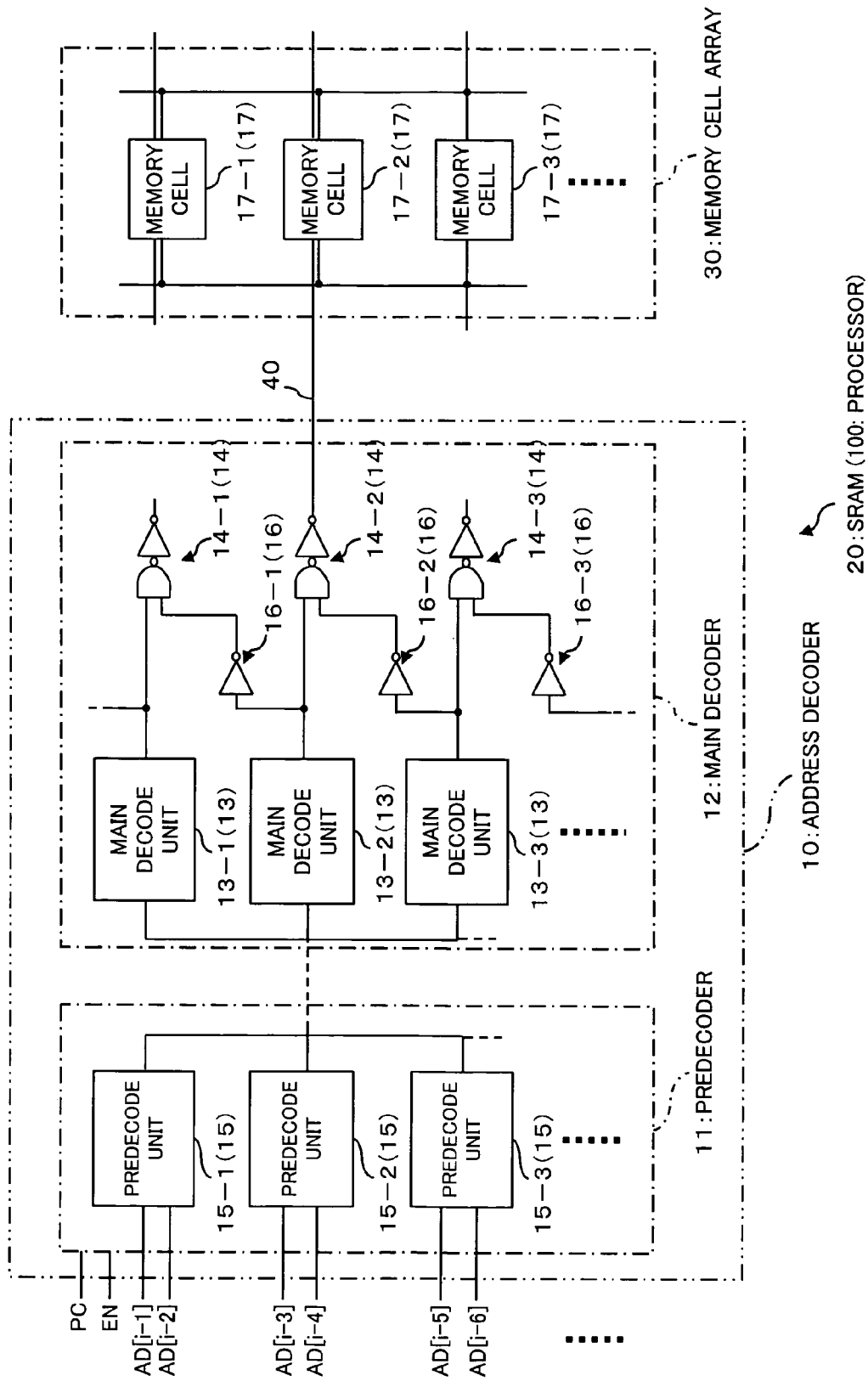
FIG. 1 is a diagram schematically showing a construction of an SRAM according to one preferred embodiment of the present invention.
Figure 2:
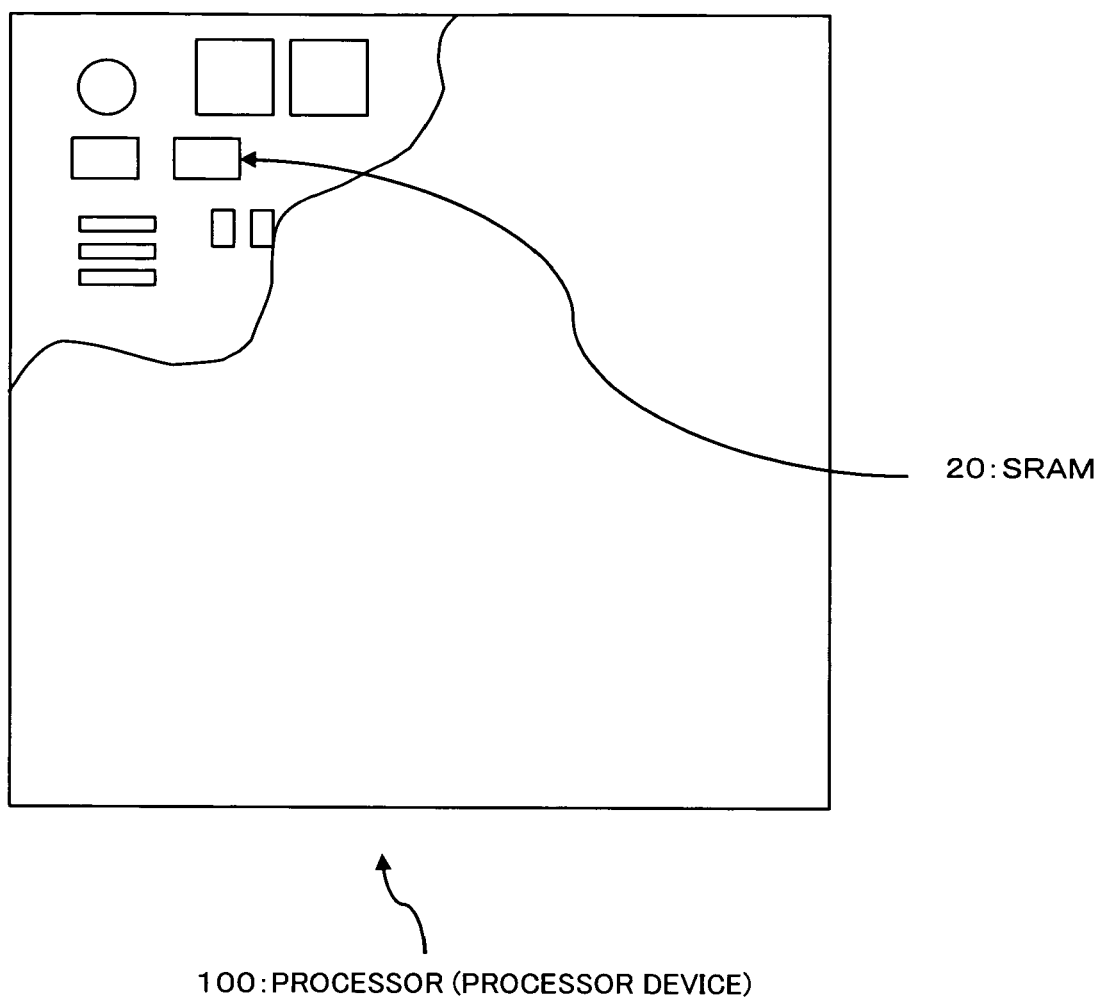
FIG. 2 is a diagram schematically showing a construction of a processor including an SRAM according to the present embodiment.
Figure 3:
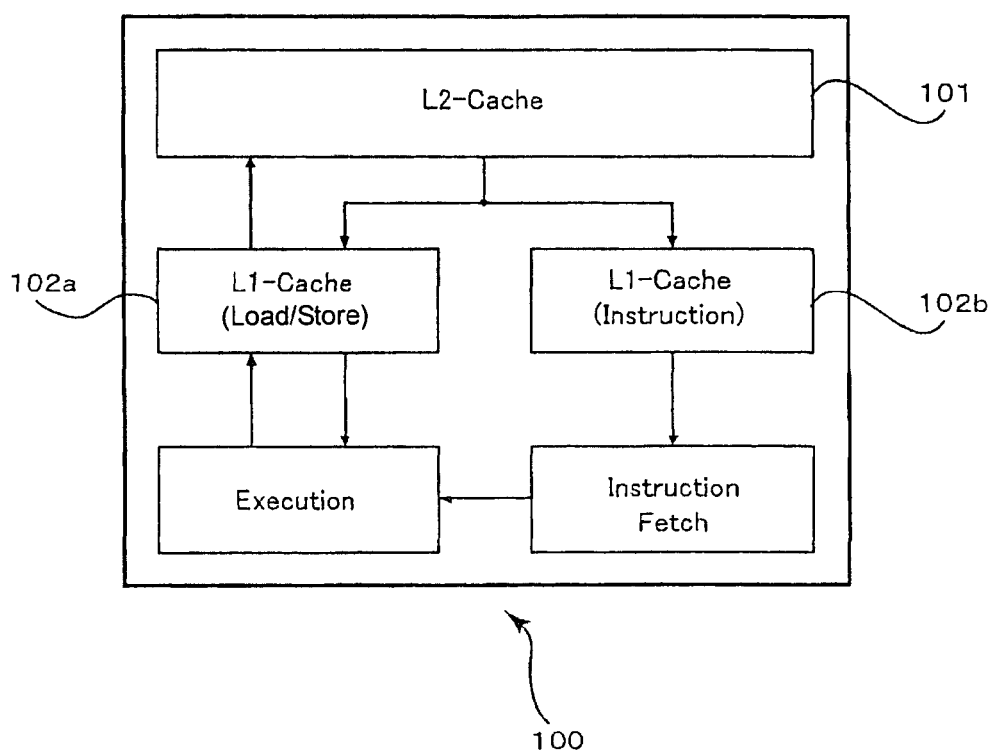
FIG. 3 is a view for describing processing performed by a processor of FIG. 2.

FIG. 1 is a diagram schematically showing a construction of an SRAM according to one preferred embodiment of the present invention; FIG. 2 is a diagram schematically showing a construction of a processor including an SRAM according to the present embodiment; FIG. 3 is a view for describing processing performed by a processor of FIG. 2.

As shown in FIG. 2, an SRAM [Static Random Access Memory; a semiconductor storage circuit which does not require a storage operation (refresh)] according to one preferred embodiment of the present invention is used as a memory circuit, such as an L1-Cache and an L2-Cache, which is provided within the same chip as that of the processor (processor device) 100 such as CPU (Central Processing Unit). In this instance, FIG. 2 is a cutaway view of the processor 100.

As shown in FIG. 3, in the processor 100, the L1 cache 102a functions as a data cache, and is used for performing processing such as data loading and data storing, etc, at the time of process execution by the processor 100. Further, L1 cache 102b functions as an instruction cache, and performs processing such as fetch (Instruction Fetch).

As shown in FIG. 1, the SRAM 20 of the present embodiment includes an address decoder 10 and a memory cell array 30.

The memory cell array 30 includes multiple (three in FIG. 1) memory cells 17-1, 17-2, and 17-3, arranged in an array form. Each of the memory cells 17-1, 17-2, and 17-3 stores data therein, thereby retaining various kinds of information.

Hereinafter, when one specific memory cell needs to be designated, reference characters 17-1, 17-2, and 17-3 are used. However, when an arbitrary memory cell is designated, reference character 17 is used.

The address decoder 10, which decodes (address decode; decode, analysis) address signals received from the outside of the SRAM 20, are provided one for each of the multiple memory cells 17, and are connected to the corresponding memory cells 17 through word lines (select signal line) 40.

In this instance, reference character AD [*] (where * is an integer of 0 through i–1; i is a natural number which represents an address bit width) expresses an input address, and address signals corresponding to this input address are input. Further, reference character PC designates a precharge signal; reference character EN designates an enable signal.

As shown in FIG. 1, the address decoder 10 has a predecoder (predecoder circuit) 11 and a main decoder (main decode circuit) 12. The predecoder 11 includes multiple (three in FIG. 1) predecode units (decode units) 15-1, 15-2, and 15-3; the main decoder 12 includes multiple (three in FIG. 1) main decode units (decode units) 13-1, 13-2, and 13-3.

Predecoder 11 and main decoder 12 evaluate whether or not input signals match address data which has been set beforehand, thereby carrying out decode processing.

Hereinafter, when one specific predecode unit needs to be designated, reference characters 15-1, 15-2, and 15-3 are used. When an arbitrary predecode unit is designated, reference character 15 is used. Likewise, when one specific main decode unit needs to be designated, reference characters 13-1, 13-2, and 13-3 are used. When an arbitrary main decode unit is designated, reference character 13 is used.

In the present SRAM 20, the predecode units 15-1, 15-2, and 15-3, and the main decode units 13-1, 13-2, and 13-3 are each realized by dynamic NOR circuits (NOR circuits formed by dynamic circuits).

Figure 4A:
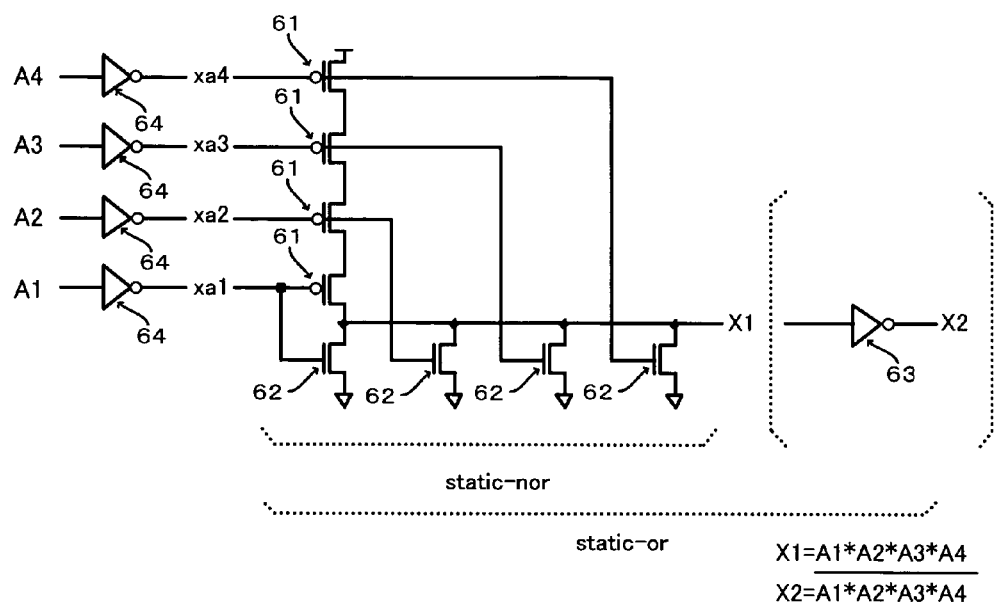
FIG. 4(a) and FIG. 4(b) a reviews each for describing NOR circuit used in an SRAM according to the present embodiment.
Figure 4B:
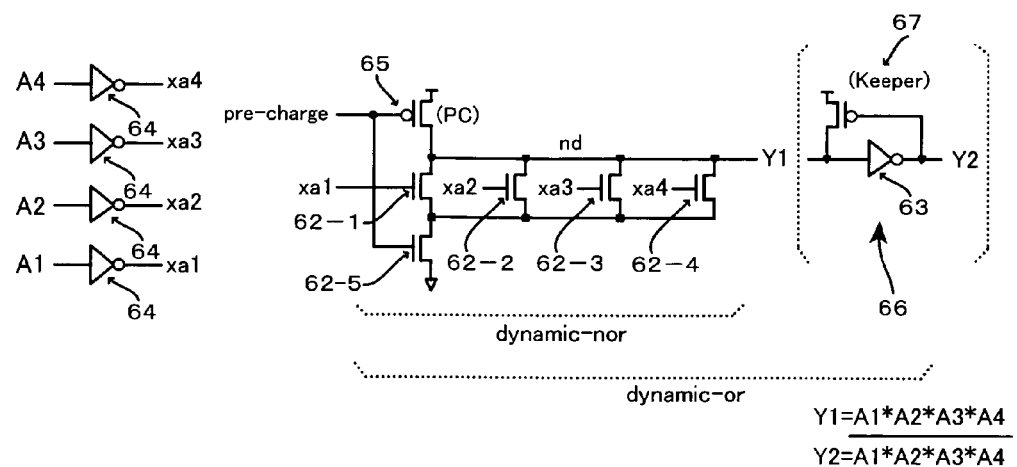

FIG. 4(a) and FIG. 4(b) are views each for describing a dynamic NOR circuit used in an SRAM 20 according to the present embodiment. FIG. 4(a) shows an example of a static NOR circuit; FIG. 4(b) shows an example of a dynamic NOR circuit.

As shown in FIG. 4(a), for example, the static NOR (static-nor) circuit includes inverters (NOT circuits) 63 and 64, pMOS transistors 61, and nMOS transistors 62. The number [four in FIG. 4(a)] of inverters 64 is equal to the number of input signals. The inverters 64 invert address signals A1 through A4 input from the outside, and generate signals xa1, xa2, xa3, and xa4.

The number [four in FIG. 4(a)] of pMOS transistors 61 is equal to the number of input signals, and these pMOS transistors 61 are arranged in series. The inverted signals xa1 through xa4 of input signals A1 through A4 are input one to each of the pMOS transistors 61. The number [four in FIG. 4(a)] of nMOS transistors 62 is equal to the number of input signals, and are arranged in parallel downstream of the pMOS transistors 61.

This static NOR circuit outputs an AND among the input signals A1, A2, A3, and A4 as an output signal X1. That is, X1=A1•A2•A3•A4 is held. (hereinafter, "•" expresses an AND operation).

In addition, as shown in FIG. 4(a), the inverter (NOT circuit) 63 provided at the output end of the static NOR circuit makes the circuit a static OR (static-or) circuit, and an output signal X2 is obtained. That is, $$X2=\overline{X1}=\overline{A1 \cdot A2 \cdot A3 \cdot A4}$$

However, since the static NOR circuit shown in FIG. 4(a) includes multiple pMOS transistors 61 connected in series, transition from Low to High with an output signal X1 is slow.

In contrast, as shown in FIG. 4(b), the dynamic NOR (dynamic-nor) circuit used in the address decoder 10 of the present SRAM 20 includes inverters (NOT circuits) 64, nMOS transistor 62-1, 62-2, 62-3, 62-4, and 62-5, and a precharged transistor 65.

The number [four in FIG. 4(b)] of inverters 64 is equal to the number of input signals. The inverters 64 invert address signals A1 through A4 input from the outside, and generate signals xa1, xa2, xa3, and xa4.

These nMOS transistor 62-1, 62-2, 62-3, and 62-4 are arranged in parallel, and receive inverted signals xa1 through xa4 of input signals A1 through A4 inverted by the inverter 64. Further, the nMOS transistor 62-5, together with the precharge transistor (PC) 65, is arranged in series with the nMOS transistor 62-1.

The precharge transistor 65 sets a dynamic node (nd) which is to be precharged, to "High" beforehand, and discharges the dynamic node (nd) to "Low" when more than one of the inputs terminals turns to be "High".

The dynamic NOR circuit outputs an AND among the input signal A1, A2, A3, and A4 as an output signal Y1. That is, Y1=A1•A2•A3•A4 is held.

Further, as shown in FIG. 4(b), the inverting circuit 66 provided at the output end of the dynamic NOR circuit makes the circuit a dynamic OR (dynamic-or) circuit, and an output signal Y2 can be obtained. That is, $$Y2=\overline{Y1}=\overline{A1 \cdot A2 \cdot A3 \cdot A4}$$

The inverting circuit 66 includes an inverter 63 and a keeper transistor (Keeper) 67 which forcibly maintains a high level once the output becomes "Low". In the dynamic circuit, when the precharge transistor 65 is in an off state and all the input terminal levels are low, the dynamic node (nd) falls in an unstable state called a floating state in which the dynamic node is connected neither to Vdd nor to Vss. At a state of normal use, such a state will cause an erroneous operation, and thus, the keeper transistor 67 prevents level lowering due to leak.

Since the dynamic NOR circuit is formed by nMOS transistors, the loads of pMOS transistors can be reduced, whereby the circuit is simplified and improved in speed.

Further, in the present SRAM 20, the main decoder 12 has AND circuits 14-1, 14-2, and 14-3, and inverters (NOT circuits) 16-1, 16-2, and 16-3, provided downstream of the main decoder units 13-1, 13-2, and 13-3.

Hereinafter, when one specific AND circuit needs to be designated, reference characters 14-1 through 14-3 are used. However, when an arbitrary AND circuit is designated, reference character 14 is used. Likewise, when one specific main inverter needs to be designated, reference characters 16-1 through 16-3 are used. However, when an arbitrary main decode unit is designated, reference character 16 is used.

The inverter (inverted signal generating unit, inverting circuit) 16 inverts an output signal from the main decode unit 13. This inverter 16 receives an output signal from the main decode units 13. Further, the output signal from the main decode unit 13, which has been inverted by the inverter 16, is input to the AND circuit 14.

The AND circuit 14 obtains a logical AND between an output signal of one decode unit and an output signal of another decoded unit 13, which has been inverted by the inverter 16, and outputs the result as a select signal for activating a memory cell 17.

This AND circuit 14 receives an output signal of a main decode unit 13, which is provided upstream of the AND circuit 14, and an output signal of another main decode unit 13 adjacent to the above main decode unit 13, which output signal is an inverted signal inverted by the inverter 16.

In the example of FIG. 1, for example, the AND circuit 14-1 receives an output signal of the main decode unit 13-1 and an output signal (inverted signal) which is output from the main decode unit 13-2 and is then inverted by the inverter 16-1. Likewise, the AND circuit 14-2 receives an output signal of the main decode unit 13-2 and an output signal (inverted signal) which is output from the main decoded unit 13-3 and is then inverted by the inverter 16-2.

Figure 5A:
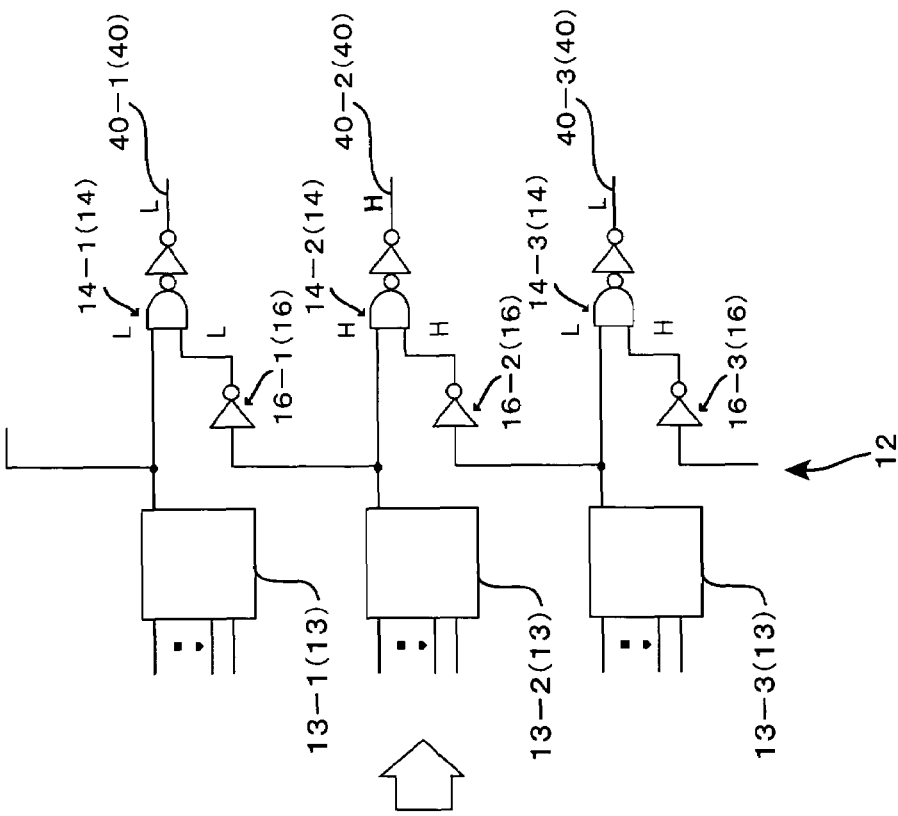
FIG. 5(a) and FIG. 5(b) a reviews each for describing a construction of a main decoder of an SRAM according to the present embodiment.
Figure 5B:
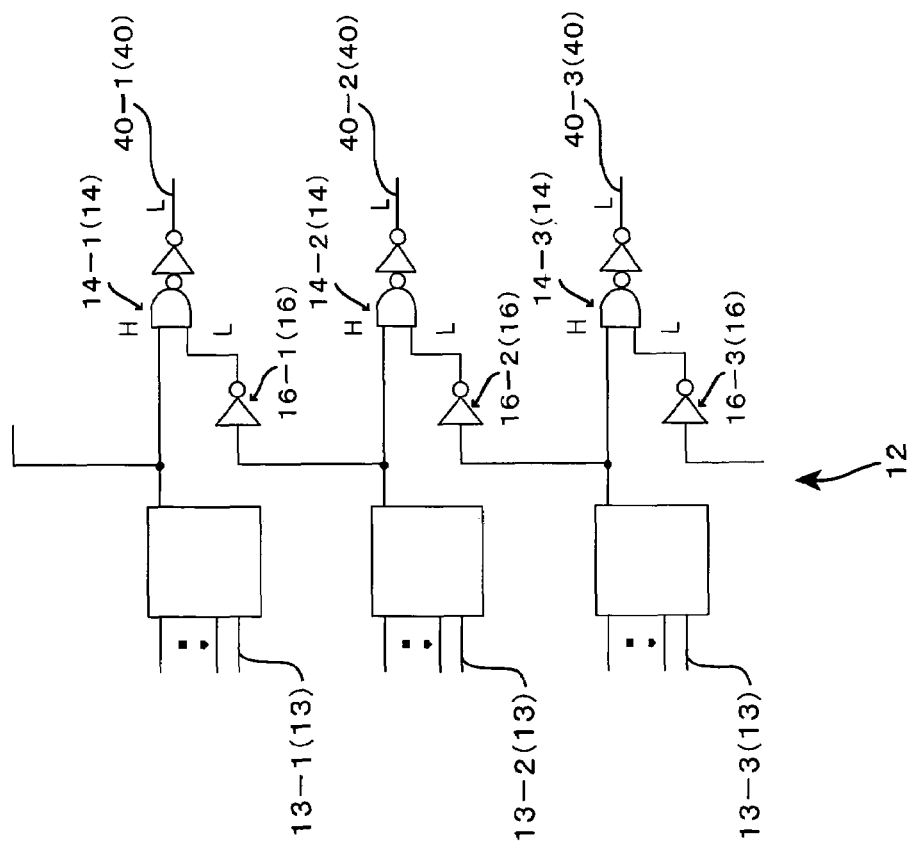

FIG. 5(a) and FIG. 5(b) are diagrams for describing a construction of a main decoder 12 of an SRAM 20 according to the present embodiment. FIG. 5(a) shows an example of an initial state before decode processing is performed; FIG. 5(b) shows a state after decode processing is performed.

For example, if decode processing is performed in the state shown in FIG. 5(a), the main decode unit 13-1 and the main decoded unit 13-3 outputs "Low (L)", and the main decode unit 13-2 outputs "High (H)". In that case, as shown in FIG. 5(b), the word line 40-2 is selected, and the state is changed from "L" to "H", and the state of the other lines 40-1 and 40-2 maintain "L".

As a result, data read/write processing can be performed to the memory cell 17 which is connected to the word line 40-2.

In the address decoder 10, the output potential of a decoder which does not match an input address is changed from "H" to "L". If this output result of the unselected circuit is regarded as a pulse signal changing from "High (H)" to "Low (L)", this signal after having being inverted by the inverter 16 can be treated as "an enable clock which has been subjected to timing adjustment with an output (main decode unit output) from the main decode units 13".

That is, by obtaining a logical AND between the above and the output of another main decode units 13, the main decode units 13 are capable of realizing an operation such that (1) the state of the selected word line 40 is changed from "L" to "H" and (2) the state of the other word lines 40 maintains "L".

In other words, in the present SRAM 20, a main decode unit 13 is capable of using a signal which is output from another main decode unit 13 adjacent thereto and is then inverted by the inverter 16 as an enable clock. This arrangement eliminates the necessity of preparing a circuit for generating an enable clock, thereby simplifying the circuit configuration and reducing power consumption. In addition, it becomes unnecessary to perform timing adjustment among main decoder units 13 in the main decoder 12.

Figure 6:
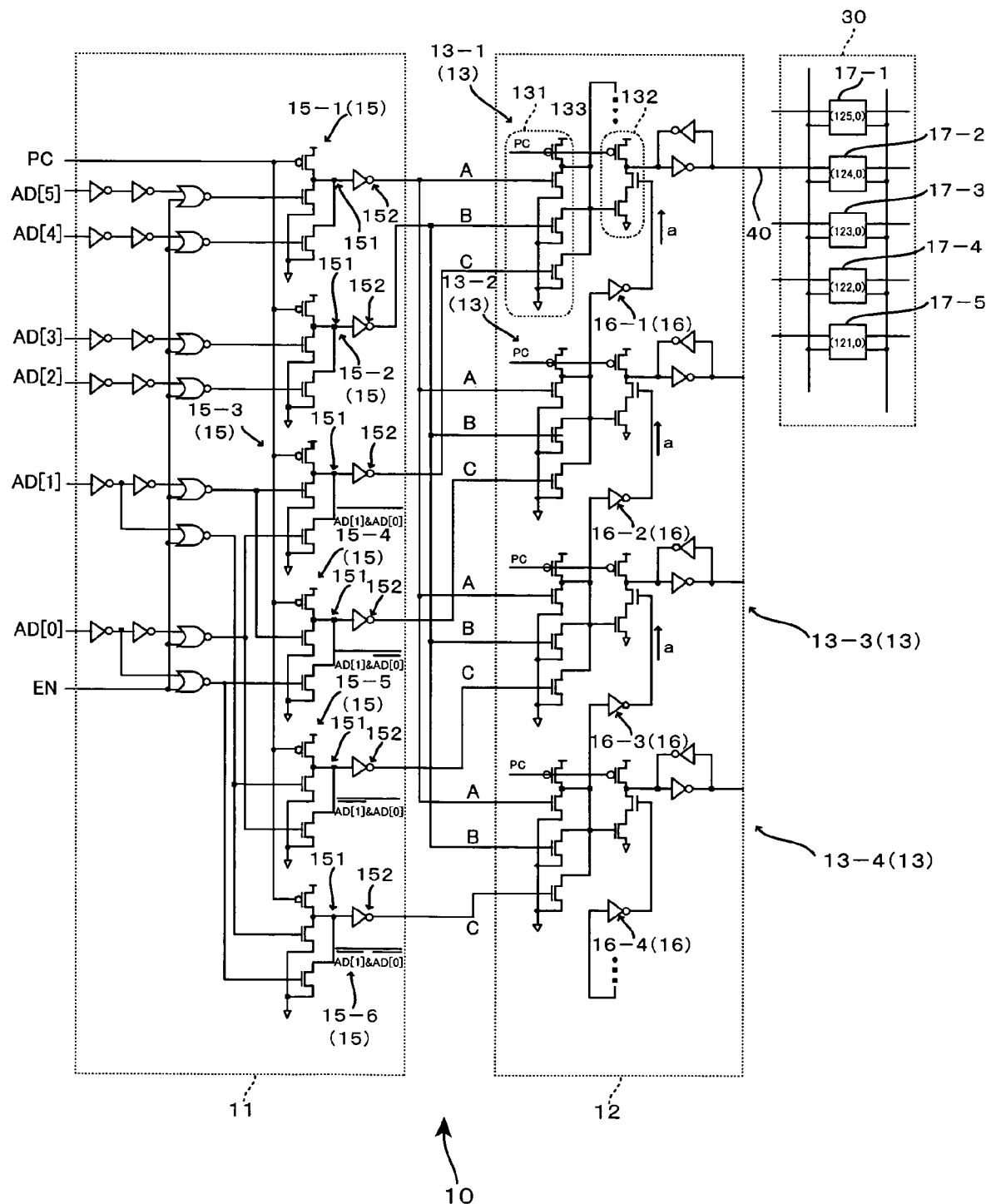
FIG. 6 is a view showing a concrete example of a construction of an SRAM according to the present embodiment.
Figure 7:
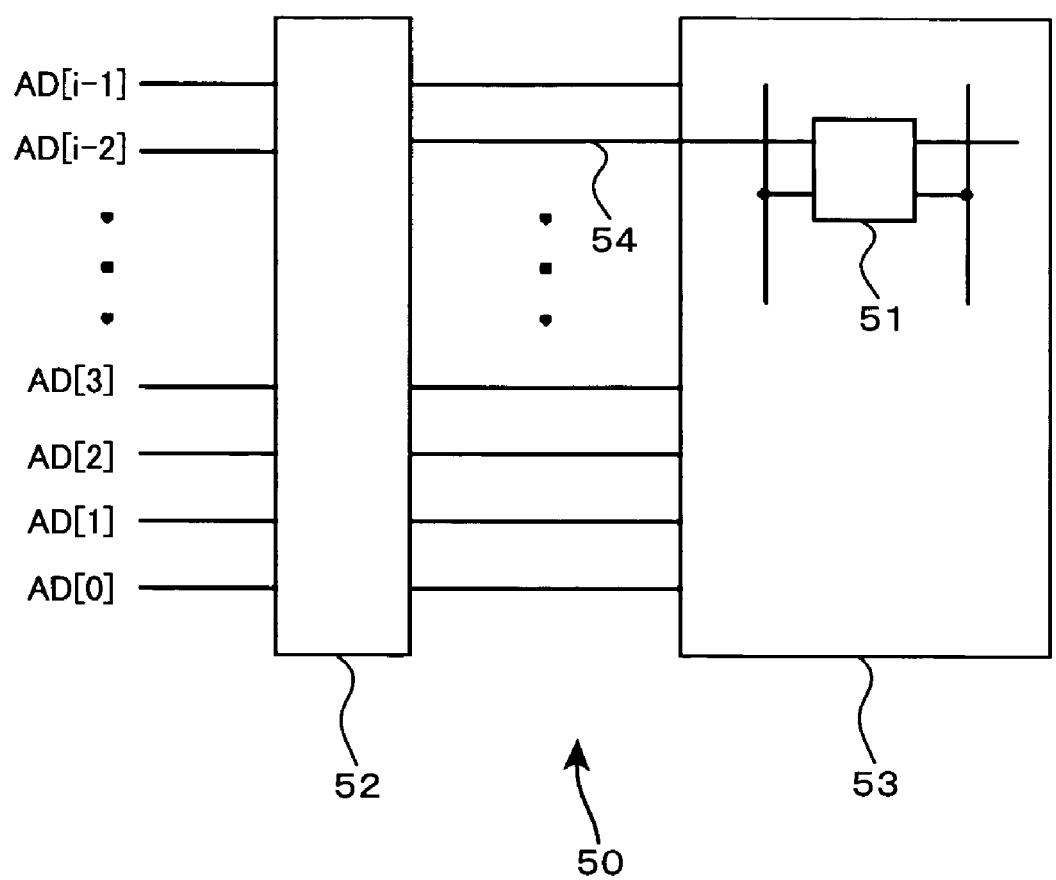
FIG. 7 is a view showing a decode circuit and a memory cell of an SRAM.
Figure 8:
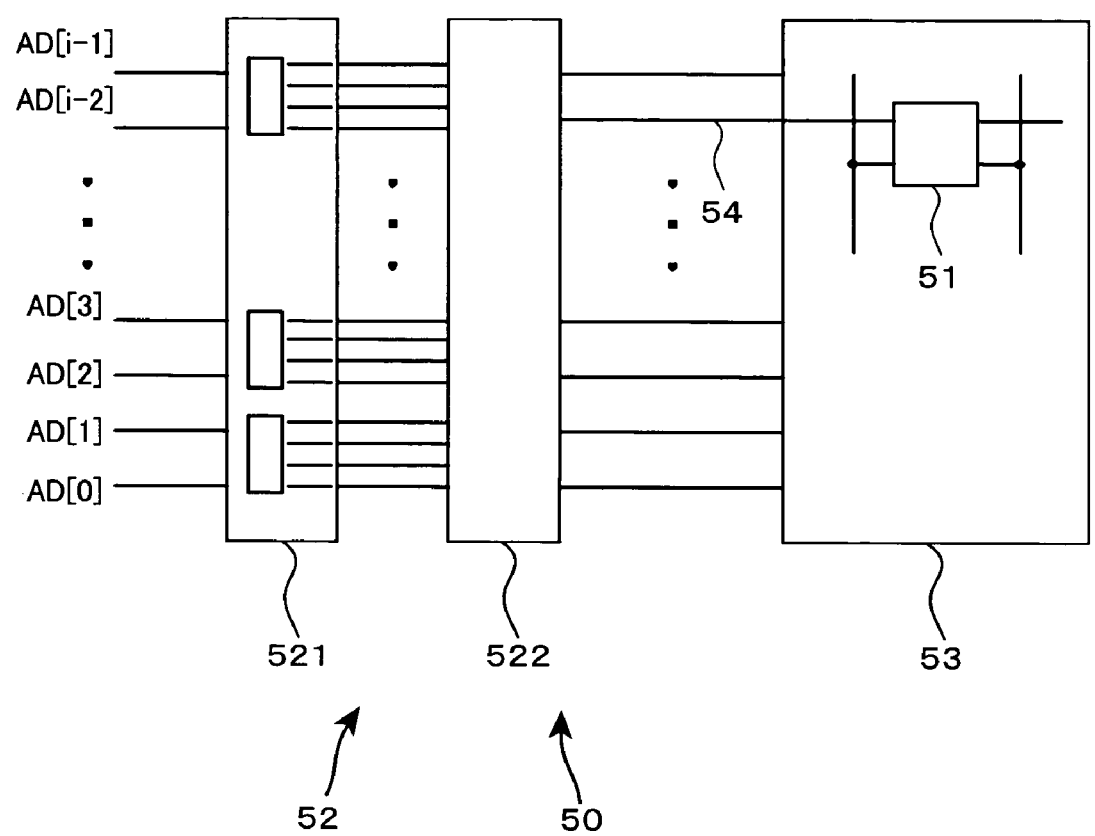
FIG. 8 is a view showing a predecoder and a main decoder of a decode circuit of the SRAM of FIG. 7.
Figure 9:
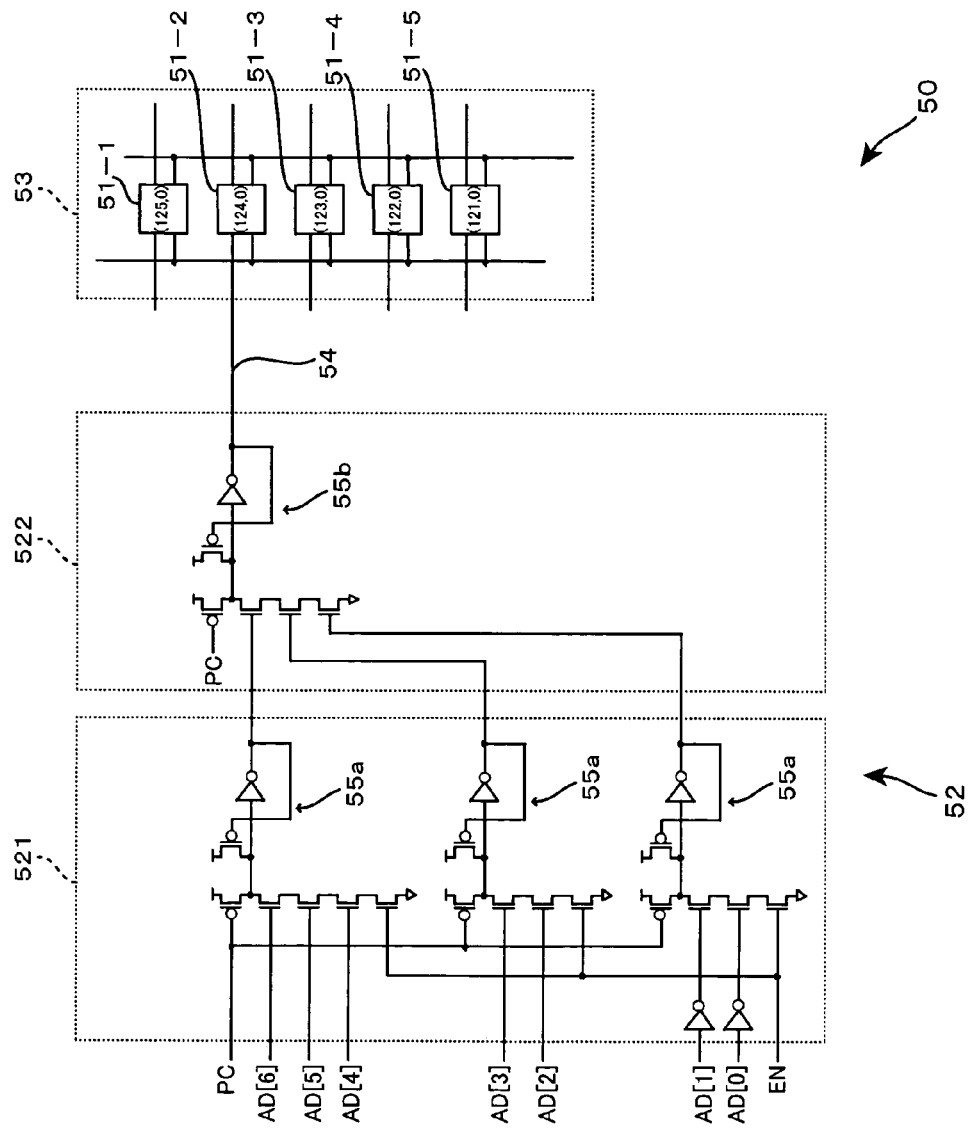
FIG. 9 is a view showing a decode circuit and memory cells of a previous SRAM.
Figure 10:
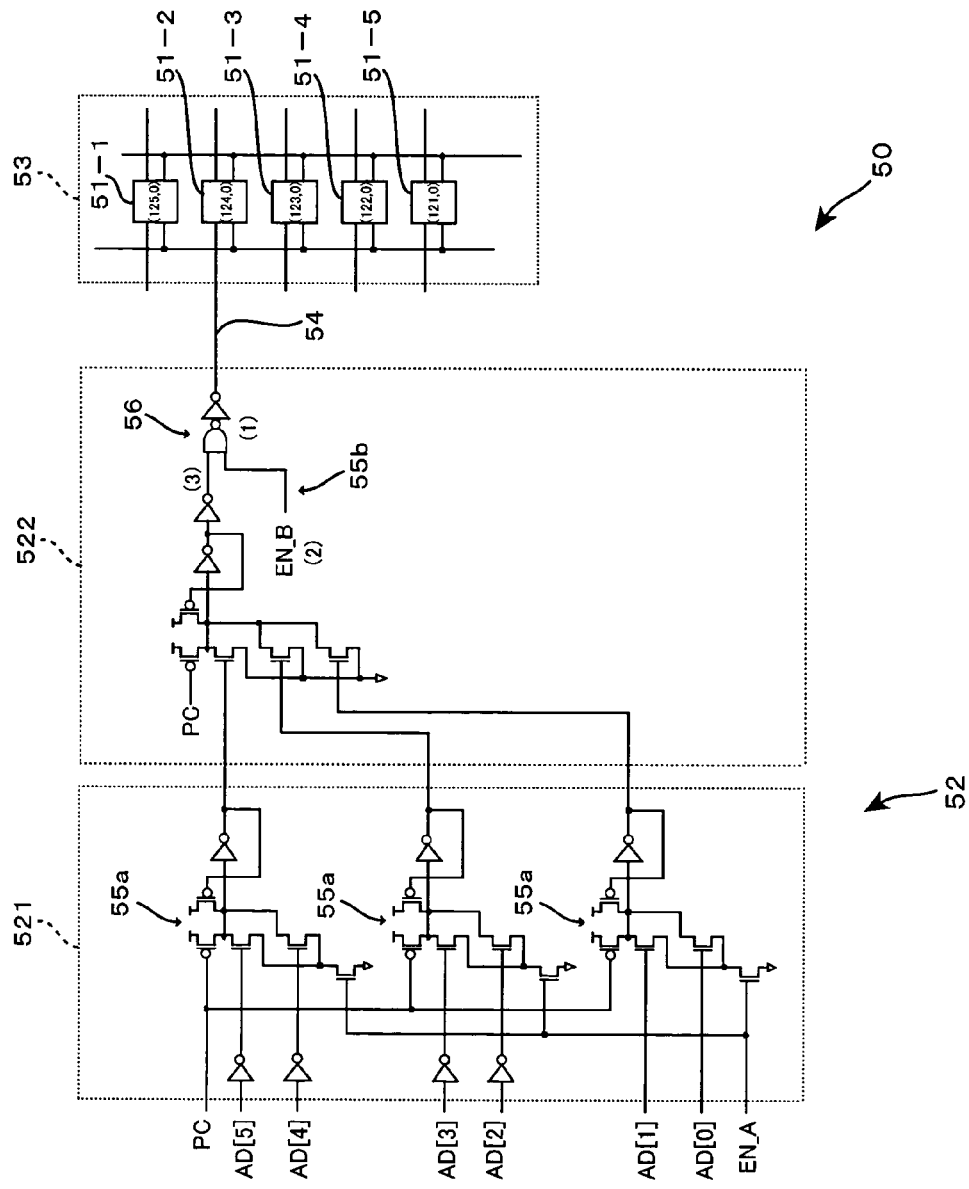
FIG. 10 is a view showing a decode circuit and memory cells of a previous SRAM.

FIG. 6 is a diagram showing a concrete example of a construction of an SRAM 20 according to one preferred embodiment of the present invention. Referring to this FIG. 6, a description will be made hereinbelow of processing performed by the address decoder 10 of the present SRAM 20.

The example of FIG. 6 shows an address decoder 10 for the memory cell 17-2 in the memory cell array 30. In the example of FIG. 6, 6-bit address signals (AD [0] through AD [5]) are input. The predecoder 11 includes predecode units 15-1 through 15-6; the main decoder 12 includes main decode units 13-1 through 13-4. In addition, in the example of FIG. 6, a keeper transistor 67 (see FIG. 4) of each predecode unit (15) is omitted.

Arbitrary two address bits are input to each predecode unit 15. In the main decoder 12, three signal lines are input from the predecoder 11 to each main decode unit 13.

In this predecode unit 15, when an input address signal matches address data having been set beforehand, the node 152 outputs "L", otherwise, the node 151 is discharged and outputs "H" to the node 152.

The main decode unit 13 includes a NOR unit 131 and a NAND unit 132. The main decode unit 13 receives the result of the predecode unit 15 and performs decode processing thereof.

If the decode processing result of the NOR unit 131 matches address data which has been set beforehand, the node 133 maintains "H". If the result does not match the address data the node 133 is discharged to "L".

The decode result is output to the NAND unit 132 at the later stage, and is also output to the NAND unit 132 of the adjacent main decode unit 13 via the inverter 16 as an enable signal (see arrow a).

The NAND unit 132 receives the result of the NOR unit 131 and an enable signal from another main decode unit 13. Only when a condition is met, the NAND unit 132 makes the result into a pulse ("L to H"), or otherwise, outputs "L" to the word line 40. With this arrangement, it is possible to perform read/write operations to an arbitrary cell.

In this instance, if a chain of the output results is formed between the neighboring main decode units 13, an erroneous operation occurs depending on combinations of inputs, because outputs of the predecoder 11 (predecode unit 15) do not always reach the main decoder 12 (main decode unit 13) at the same time. More specifically, an enable signal from another main decode unit 13 can be received before a decision is made by the NOR circuit, thereby causing multiple selection of word lines 40.

Accordingly, it is necessary to confirm arrival times among input signals of the main decode units 13 which send/receive enable signals. For example, assuming that the number of inputs to the main decode unit 13 is n, it is necessary to evaluate whether or not an erroneous operation occurs between 2n signals at maximum, so that the number of simulation patterns is increased.

Therefore, in the present embodiment, when the number of predecoded signals which are received by each main decode unit 13 is n, (n–1)-number of input signals make a group, and sending/receiving of an enable signal is performed within this group.

In the example of FIG. 6, three signal lines (n=3) are input from the predecoder 11 to each main decode unit 13. Of these three signal lines A, B, and C, signal A and signal B are arranged in a common group, thereby making it possible to transceive an enable signal.

As a result, the number of signals in which variation should be considered is reduced to two, and thus, timing ensured between these two signals can suppress erroneous operations, so that effort required in circuit design is reduced.

In this manner, according to the SRAM 20 of the present embodiment, the processing speed of the decoder is increased. In addition, the necessity of an additional circuit for generating an enable signal for the main decode unit 13 is eliminated, whereby the circuit construction is simplified.

Further, an enable signal for the main decoder 12 is generated within the main decoder 12, so that timing adjustment with each input signal is not necessary. Hence, effort required in circuit design is reduced.

Furthermore, an effect of timing self-correction with respect to manufacturing variations at the time of LSI manufacturing can also be expected.

Moreover, the present invention should by no means be limited to the above-illustrated embodiment, and various changes or modifications may be suggested without departing from the gist of the invention.

For example, the number of bits input to the address decoder 10 should not be limited to six, and two through five bits or more than seven bits can be applied.

Further, the constructions of the predecode unit 15 and the main decode unit 13 should by no means be limited to those of the above-described embodiment, and various changes or modifications may be suggested without departing from the gist of the invention.

The present invention can be summarized as follows.

There is provided a processor device, comprising a semiconductor memory, the semiconductor memory including:

a plurality of memory cells for storing data therein;

an address decoder, provided corresponding to the plurality of memory cells, for selectively activating one of the memory cells according to address signals input therein, and the address decoder including:

a plurality of decode units each formed by a dynamic NOR circuit;

an inverting signal generating unit which inverts an output of a first decode unit of the plurality of decoded units; and an AND circuit which performs a logical AND operation between an output signal of the first decode unit, having been inverted by the inverting signal generating unit, and an output signal of a second decode unit which is adjacent to the first decode unit, and outputs the result of the logical AND operation as a select signal.

As a preferred feature, the address decoder, comprises:

a predecoder which predecodes the address signals; and a main decoder, provided downstream of the predecoder, for decoding the address signals, which have been predecoded by the predecoder, the main decoder including:

a plurality of decode units each formed by the dynamic NOR circuit;

the inverting signal generating unit; and the AND circuit.

As a generic feature, there is provided a semiconductor storage circuit, comprising:

a plurality of memory cells for storing data therein; and an address decoder, provided corresponding to the plurality of memory cells, for selectively activating one of the memory cells according to address signals input therein, the address decoder including:

a plurality of decode units each formed by a dynamic NOR circuit;

an inverting signal generating unit which inverts an output of a first decode unit of the plurality of decoded units; and an AND circuit which performs a logical AND operation between an output signal of the first decode unit, having been inverted by the inverting signal generating unit, and an output signal of a second decode unit which is adjacent to the first decode unit, and outputs the result of the logical AND operation as a select signal.

As a preferred feature, the address decoder comprises:

a predecoder which predecodes the address signals; and a main decoder, provided downstream of the predecoder, for decoding the address signals, which have been predecoded by the predecoder, the main decoder including:

a plurality of decode units each formed by the dynamic NOR circuit;

the inverting signal generating unit; and the AND circuit.

As yet another generic feature, there is provided an address decoder, provided corresponding to the plurality of memory cells, for selectively activating one of the memory cells according to the address signals input therein, the address decoder comprising:

a plurality of decode units each formed by a dynamic NOR circuit;

an inverting signal generating unit which inverts an output of a first decode unit of the plurality of decoded units; and an AND circuit which performs a logical AND operation between an output signal of the first decode unit, having been inverted by the inverting signal generating unit, and an output signal of a second decode unit which is adjacent to the first decode unit, and outputs the result of the logical AND operation as a select signal.

As a preferred feature, the address decoder, further comprises:

a predecoder which predecodes the address signals; and a main decoder, provided downstream of the predecoder, for decoding the address signals, which have been predecoded by the predecoder, the main decoder including:

a plurality of decode units each formed by the dynamic NOR circuit;

the inverting signal generating unit; and the AND circuit.

The application of the present invention should by no means be limited to address signal decoding, and the present application can be applied to decoding processes of various types of information.

What is claimed is:

1. An address decoder connected to memory cells for selectively activating the memory cells according to input address signals, said address decoder comprising:
   a plurality of decode units each formed by a combinational logic circuit;
   an inverting circuit inverting an output of said decode unit;
   an AND circuit performing a logical AND operation on one of output signals of said decode units and another one of output signals of said decode units, which is inverted by said inverting circuit.

2. An address decoder according to claim 1, further comprising:
   a plurality of predecode units which decode the input address signals, and
   a main decode unit connected to said plurality of predecode units, and receives outputs of said plurality of predecode units, and performs further decoding thereof.

3. A memory device, comprising:
   a plurality of memory cells for storing information therein; and
   an address decoder connected to the memory cells for selectively activating the memory cells according to input address signals,
   said address decoder including:
      a plurality of decode units each formed by a combinational logic circuit;
      an inverting circuit inverting an output of said decode unit;
      an AND circuit performing a logical AND operation on one of output signals of said decode units and another one of output signals of said decode units, which is inverted by said inverting circuit, and outputting the operation result as a select signal for activating said memory cells.

4. A memory device according to claim 3, further comprising:
   a plurality of predecode units which decode the input address signals, and
   a main decode unit connected to said plurality of predecode units, and receives outputs of said plurality of predecode units, and performs further decoding thereof.

5. A processor device, comprising a memory device,
   said memory device including:
   a plurality of memory cells for storing information therein; and
   an address decoder connected to the memory cells for selectively activating the memory cells according to input address signals,
   said address decoder including:
      a plurality of decode units each formed by a combinational logic circuit;
      an inverting circuit inverting an output of said decode unit;
      an AND circuit performing a logical AND operation on one of output signals of said decode units and another one of output signals of said decode units, which is inverted by said inverting circuit, and outputting the operation result as a select signal for activating said memory cells.

6. A processor device according to claim 5, wherein said address decoder includes:
   a plurality of predecode units decoding the input address signals, and
   a main decode unit connected to said plurality of predecode units, and receives outputs of said plurality of predecode units, and performs further decoding thereof.

7. An address decoding method for the memory device selectively activating a memory cell according to input address signals, comprising the steps of:
   decoding the input address signals;
   inverting the decoding; and
   performing a logical AND operation on the decoding result and the inverting result, and outputting the operation result as a select signal for activating said memory cells.

8. An address decoding method according to claim 7, wherein said decoding step further comprising the steps of:
   a plurality of predecoding steps for decoding the input address signals; and
   a main decoding step for receiving the decoding result obtained by said plurality of predecoding steps and performing further decoding thereof.

* * * * *

UNITED STATES PATENT AND TRADEMARK OFFICE
CERTIFICATE OF CORRECTION

PATENT NO. : 7,349,287 B2
APPLICATION NO. : 11/385717
DATED : March 25, 2008
INVENTOR(S) : Seiji Murata et al.

It is certified that error appears in the above-identified patent and that said Letters Patent is hereby corrected as shown below:

Title Page, Col. 2, FOREIGN PATENT DOCUMENTS

Line 4, after "1998-072847" delete "11/1999" and insert --11/1998-- therefor.

Signed and Sealed this

Twelfth Day of August, 2008

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,349,287 B2 |
| APPLICATION NO. | : 11/385717 |
| DATED | : March 25, 2008 |
| INVENTOR(S) | : Seiji Murata et al. |

It is certified that error appears in the above-identified patent and that said Letters Patent is hereby corrected as shown below:

Title Page, Col. 2, FOREIGN PATENT DOCUMENTS

Line 4, after "1998-072847" delete "11/1999" and insert --11/1998-- therefor.

Signed and Sealed this

Twenty-sixth Day of August, 2008

JON W. DUDAS
*Director of the United States Patent and Trademark Office*